United States Patent
Wuori

(10) Patent No.: US 11,222,676 B2
(45) Date of Patent: *Jan. 11, 2022

(54) NARROW ETCHED GAPS OR FEATURES IN MULTI-PERIOD THIN-FILM STRUCTURES

(71) Applicant: Integrated Magnetoelectronics Corp., Berkeley, CA (US)

(72) Inventor: Edward Wuori, Saint Paul, MN (US)

(73) Assignee: Integrated Magnetoelectronics Corp., Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/947,172

(22) Filed: Jul. 21, 2020

(65) Prior Publication Data

US 2020/0349992 A1 Nov. 5, 2020

Related U.S. Application Data

(63) Continuation of application No. 15/833,424, filed on Dec. 6, 2017, now Pat. No. 10,762,940.

(60) Provisional application No. 62/432,421, filed on Dec. 9, 2016.

(51) Int. Cl.
| | |
|---|---|
| *G11B 5/39* | (2006.01) |
| *G11C 11/16* | (2006.01) |
| *H01L 43/02* | (2006.01) |
| *H01L 27/22* | (2006.01) |
| *H01F 10/32* | (2006.01) |
| *H01L 43/08* | (2006.01) |
| *H01L 43/12* | (2006.01) |

(52) U.S. Cl.
CPC .......... *G11C 11/161* (2013.01); *G11B 5/3903* (2013.01); *G11C 11/1697* (2013.01); *H01F 10/3281* (2013.01); *H01L 27/222* (2013.01); *H01L 43/02* (2013.01); *H01L 43/08* (2013.01); *H01L 43/12* (2013.01); *G11B 2005/3996* (2013.01)

(58) Field of Classification Search
None
See application file for complete search history.

(56) References Cited

U.S. PATENT DOCUMENTS

| | | |
|---|---|---|
| 5,237,529 A | 8/1993 | Spitzer |
| 5,491,338 A | 2/1996 | Spitzer |
| 5,587,943 A | 12/1996 | Torok et al. |
| 5,592,413 A | 1/1997 | Spitzer |
| 5,929,636 A | 7/1999 | Spitzer et al. |
| 6,031,273 A | 2/2000 | Torok et al. |

(Continued)

FOREIGN PATENT DOCUMENTS

WO   WO 2004/061855   7/2004

OTHER PUBLICATIONS

PCT International Search Report and Written Opinion, dated Aug. 30, 2018, issued in PCT/US2017/064864.

(Continued)

*Primary Examiner* — Shamim Ahmed
(74) *Attorney, Agent, or Firm* — Weaver Austin Villeneuve & Sampson LLP

(57) ABSTRACT

Multi-period thin-film structures exhibiting giant magnetoresistance (GMR) are described. Techniques are also described by which narrow spacing and/or feature size may be achieved for such structures and other thin-film structures having an arbitrary number of periods.

26 Claims, 10 Drawing Sheets

(56) References Cited

U.S. PATENT DOCUMENTS

| | | |
|---|---|---|
| 6,469,927 B2 | 10/2002 | Spitzer et al. |
| 6,483,740 B1 | 11/2002 | Spitzer et al. |
| 6,538,437 B2 | 3/2003 | Spitzer et al. |
| 6,573,713 B2 | 6/2003 | Spitzer et al. |
| 6,594,175 B2 | 7/2003 | Torok et al. |
| 6,669,983 B2 | 12/2003 | Kagami et al. |
| 6,738,284 B2 | 5/2004 | Torok et al. |
| 6,859,063 B2 | 2/2005 | Nuspl et al. |
| 6,992,919 B2 | 1/2006 | Andrei et al. |
| 7,005,852 B2 | 2/2006 | Andrei et al. |
| 7,220,968 B2 | 5/2007 | Burger et al. |
| 7,224,566 B2 | 5/2007 | Barna et al. |
| 7,767,386 B2 | 8/2010 | Dunn |
| 7,911,830 B2 | 3/2011 | Torok et al. |
| 8,300,455 B2 | 10/2012 | Torok et al. |
| 8,619,467 B2 | 12/2013 | Torok et al. |
| 9,716,129 B1 | 7/2017 | Sim et al. |
| 9,741,923 B2 | 8/2017 | Torok et al. |
| 10,170,171 B2 | 1/2019 | Wuori et al. |
| 10,762,940 B2 | 9/2020 | Wuori |
| 2002/0037595 A1 | 3/2002 | Hosotani |
| 2004/0165425 A1 | 8/2004 | Nakamura et al. |
| 2005/0083743 A1 | 4/2005 | Andrei et al. |
| 2005/0128794 A1 | 6/2005 | Sussner |
| 2005/0269612 A1 | 12/2005 | Torok et al. |
| 2010/0124813 A1 | 5/2010 | Matamis et al. |
| 2011/0100953 A1 | 5/2011 | Tanaka et al. |
| 2011/0227020 A1 | 9/2011 | Sekar et al. |
| 2013/0147045 A1* | 6/2013 | Grossi ............... H01L 27/11573 257/741 |
| 2013/0208535 A1 | 8/2013 | Kwon et al. |
| 2015/0243518 A1 | 8/2015 | deVilliers |
| 2017/0244030 A1 | 8/2017 | Park et al. |
| 2018/0166097 A1 | 6/2018 | Wuori |

OTHER PUBLICATIONS

PCT International Preliminary Report on Patentability, dated Aug. 30, 2018, issued in PCT/US2017/064864.
PCT International Search Report and Written Opinion, dated Mar. 15, 2018, issued in PCT/US2017/065165.
PCT International Preliminary Report on Patentability, dated Jun. 20, 2019, issued in PCT/US2017/065165.
U.S. Notice of Allowance dated Oct. 11, 2018 issued in U.S. Appl. No. 15/835,217.
U.S. Office Action dated Jan. 28, 2020 issued in U.S. Appl. No. 15/833,424.
U.S. Notice of Allowance dated May 28, 2020 issued in U.S. Appl. No. 15/833,424.
EP Extended Search Report, dated Jun. 25, 2020, issued in EP 17878601.8.
Torok, et al., "Transpinnor: A New Giant Magnetoresistive Spin-Valve Device," 2002 IEEE International Magnetics Conference. Intermag Europe 2002. Digest of Technical Papers. Amsterdam, the Netherlands, Apr. 28-May 2, 2002; p. AV08.
U.S. Appl. No. 16/447,777, filed Jun. 20, 2019, Torok, et al.
EP Extended Search Report, dated Jul. 16, 2021, issued in EP 17934352.0.

* cited by examiner

NARROW ETCHED GAPS OR FEATURES IN MULTI-PERIOD THIN-FILM STRUCTURES

INCORPORATION BY REFERENCE

An Application Data Sheet is filed concurrently with this specification as part of this application. Each application to which this application claims benefit or priority as identified in the concurrently filed Application Data Sheet is incorporated by reference herein in its entirety and for all purposes.

BACKGROUND

The present application relates to multi-period, thin-film structures, and to techniques for forming such structures.

Magnetoresistance refers to the dependence of the resistance of ferromagnetic materials on the relative orientation of the current and magnetization directions. There are several "flavors" of magnetoresistance, each being attributed to different underlying mechanisms. Technology developed in recent years by Integrated Magnetoelectronics (IME) of Berkeley, Calif., is based on layered magnetic structures characterized by either giant magnetoresistance (GMR) or tunnel magnetoresistance (TMR); collectively, quantum magnetoresistance (QMR). See, for example, the various U.S. patent documents incorporated by reference below. This technology includes both magnetic memories and magnetic circuits; the latter being based on the Transpinnor®, IME's proprietary solid-state circuit component that can replace a variety of semiconductor components, including the semiconductor transistor.

Optimal performance of QMR devices calls for QMR structures with low drive fields and high values of QMR. There has been substantial activity in the development of TMR structures over the past decade, driven in large measure by theoretical predictions that TMR values of 1000% or more should be realizable in structures in which the amorphous $Al_2O_3$ barrier layer that was originally used is replaced with a polycrystalline MgO barrier layer. Several experimental groups have achieved room-temperature values up to 220%, using an MgO insulator, and TMR values around 200% are now found routinely in simple structures. More recently, TMR values over 1000% at room temperature have been observed under special conditions.

The experimental situation with regard to GMR is significantly different. Despite massive industry and academic efforts over more than two decades, the GMR value has not budged over about 20% for simple structures. Values of GMR around 100% have been achieved in a class of so-called superlattices (i.e., multi-period structures with many periods of a repeating pattern of magnetic layers separated by non-magnetic layers) that are coupled antiferromagnetically across the active interfaces, but this class of structures typically requires very large switching fields that are impractically large for commercially viable devices.

It may seem therefore that TMR should be the effect of choice for devices and systems based on magnetoresistance. There is, however, a compelling reason for using GMR rather than TMR. Though TMR-based devices are expected to be viable down to near nanoscale features, thermal stability of QMR devices becomes a significant issue at the deep nanoscale level, and this issue is much more readily addressed using GMR than TMR.

Resistance of the simplest GMR structure—two magnetic layers separated by a non-magnetic metal spacer such as chromium (Cr), copper (Cu), or ruthenium (Ru)—is relatively low if the two magnetizations are parallel, relatively high if anti-parallel. This is the case irrespective of whether the exchange coupling between the two layers is ferromagnetic or antiferromagnetic.

There is an exchange coupling between two magnetic layers through the non-magnetic spacer between them. Exchange coupling is an indirect interaction mechanism of the magnetic layers mediated by the non-magnetic spacer layer. This coupling can be either ferromagnetic or antiferromagnetic. If the former, the direction of magnetization (also referred to herein as the magnetization vector) of the two magnetic layers tend to be aligned or parallel in the low-energy or ground state (e.g., in the absence of an external magnetic field), i.e., the low-resistance configuration. By contrast, for GMR structures in which the exchange coupling is antiferromagnetic, the magnetization vectors tend to be anti-parallel in the ground state, i.e., the high-resistance configuration.

If the coupling is antiferromagnetic, it is possible to realize parallel alignment of the magnetization vectors, and therefore the GMR effect, by saturating the structure. Superlattices (structures having many multi-layer periods, e.g., >about 50 periods) in which the exchange coupling is antiferromagnetic have been shown to have large values of GMR but, if the antiferromagnetic coupling is very strong, the magnetic fields necessary to drive the structures to saturation are impractically large for use in commercially viable systems or devices, e.g., on the order of 10,000 Oersteds (Oe).

The current understanding of the nature of the exchange coupling in GMR structures—ferromagnetic or antiferromagnetic—is as an oscillatory function of spacer thickness, with the strength of the coupling decreasing with increasing thickness of the non-magnetic layers separating the magnetic layer. See, for example, FIG. 1 in which a coupling field $H_e$ is shown as a function of copper spacer thickness for a [Cu/Co]×50 lattice. Positive $H_e$ corresponds to spacer thicknesses which results in antiferromagnetic coupling. Negative $H_e$ corresponds to spacer thicknesses which results in ferromagnetic coupling. FIG. 2 shows GMR (lower plot) as a function of spacer thickness for the [Co/Cu]×50 lattice of FIG. 1. As shown, for spacer thicknesses corresponding to the ferromagnetic coupling regions of the structure, no GMR effect is observed. The four small graphs in FIG. 2 show the normalized magnetization of the two magnetic layers as a function of applied magnetic field in kilo-Oersteds.

SUMMARY

According to a particular class of implementations, multi-period structures and methods for forming multi-period structures are provided. A first multi-layer film is formed on a substrate. The first multi-layer film is etched to form first structures. The first structures are planarized with a planarizing material. A portion of the planarizing material is removed to expose a top surface of each of the first structures. A second multi-layer film is formed on the remaining planarizing material and the top surfaces of the first structures. The second multi-layer film is etched to form second structures. Each of the second structures is aligned with and in contact with the top surface of a corresponding one of the first structures and forming a multi-period structure therewith.

According to a particular sub-class of implementations, the forming, etching, planarizing, and removing is repeated a plurality of times to achieve a specified number of periods for each of the multi-period structures. In some implementations of this sub-class, the specified number of periods is greater than about 50, and a gap between adjacent ones of the multi-period structures has a width of about a thickness of one of the periods. In some implementations of this sub-class, the specified number of periods is greater than about 50, and a width of one of the multi-period structures is about a thickness of one of the periods.

According to a particular sub-class of implementations, the multi-period structures exhibit giant magnetoresistance (GMR).

According to a particular sub-class of implementations, each period of each multi-period structure includes a first portion having a plurality of magnetic layers separated by intervening non-magnetic layers. The plurality of magnetic layers include outer magnetic layers. The first portion is characterized by antiferromagnetic coupling between adjacent ones of the magnetic layers, and has an overall magnetization orientation that is antiparallel with magnetization orientations of the outer magnetic layers. Each period of each multi-period structure also includes a second portion adjacent and separated from the first portion by an intervening non-magnetic layer. The second portion includes one or more magnetic layers.

In some implementations of this sub-class, the second portion of each period of each multi-period structure has an active magnetic interface with the outer magnetic layer of the corresponding first portion. The active magnetic interface is characterized by ferromagnetic coupling, and when relative magnetization orientations across each active magnetic interface are reversed, a resistance of the multi-period structure changes.

In some implementations of this sub-class, the first portion of each period of each multi-period structure is characterized by a higher coercivity than the corresponding second portion. In other implementations of this sub-class, the second portion of each period of each multi-period structure is characterized by a higher coercivity than the corresponding first portion.

According to a particular sub-class of implementations, each of the first structures and each of the second structures correspond to a single period of the corresponding multi-period structure.

According to a particular sub-class of implementations, each of the first structures and each of the second structures correspond to more than one period of the corresponding multi-period structure.

According to a particular class of implementations, a device includes a substrate and a plurality of thin-film structures on the substrate. Each thin-film structure has at least 10 periods. Each period of each thin-film structure has a thickness and includes a plurality of layers. A configuration of the thin-film structures on the substrate is characterized by a minimum spacing between adjacent ones of the thin-film structures. The minimum spacing is about the thickness.

According to a particular sub-class of implementations, each thin-film structure has more than about 50 periods.

According to a particular sub-class of implementations, a first thin-film structure has a width that is about the thickness.

According to a particular sub-class of implementations, at least some of the thin-film structures exhibit giant magnetoresistance (GMR).

According to a particular sub-class of implementations, each period of each thin-film structure includes a first portion having a plurality of magnetic layers separated by intervening non-magnetic layers. The plurality of magnetic layers includes outer magnetic layers. The first portion is characterized by antiferromagnetic coupling between adjacent ones of the magnetic layers, and has an overall magnetization orientation that is antiparallel with magnetization orientations of the outer magnetic layers. Each period of each thin-film structure also includes a second portion adjacent and separated from the first portion by an intervening non-magnetic layer. The second portion includes one or more magnetic layers.

In some implementations of this sub-class, the second portion of each period of each thin-film structure has an active magnetic interface with the outer magnetic layer of the corresponding first portion. The active magnetic interface is characterized by ferromagnetic coupling, and when relative magnetization orientations across each active magnetic interface are reversed, a resistance of the thin-film structure changes.

In some implementations of this sub-class, the first portion of each period of each multi-period structure is characterized by a higher coercivity than the corresponding second portion. In other implementations of this sub-class, the second portion of each period of each multi-period structure is characterized by a higher coercivity than the corresponding first portion.

According to a particular class of implementations, a device includes a substrate and a plurality of thin-film structures on the substrate. Each thin-film structure exhibits giant magnetoresistance (GMR) and has at least 50 periods. Each period of each thin-film structure has a thickness and includes a plurality of layers. A configuration of the thin-film structures on the substrate is characterized by a minimum spacing between adjacent ones of the thin-film structures. The minimum spacing is about the thickness, and a first thin-film structure has a width that is about the thickness.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations.

Some implementations within the scope of this disclosure may be practiced without some or all of these details. Further, well known features may not have been described in detail for the sake of clarity.

Multi-period GMR structures are described in which the exchange coupling across the active interfaces of the structure is ferromagnetic. Techniques are also described by which narrow spacing and/or feature size may be achieved for such structures and other thin-film structures having an arbitrary number of periods.

Figure 1:
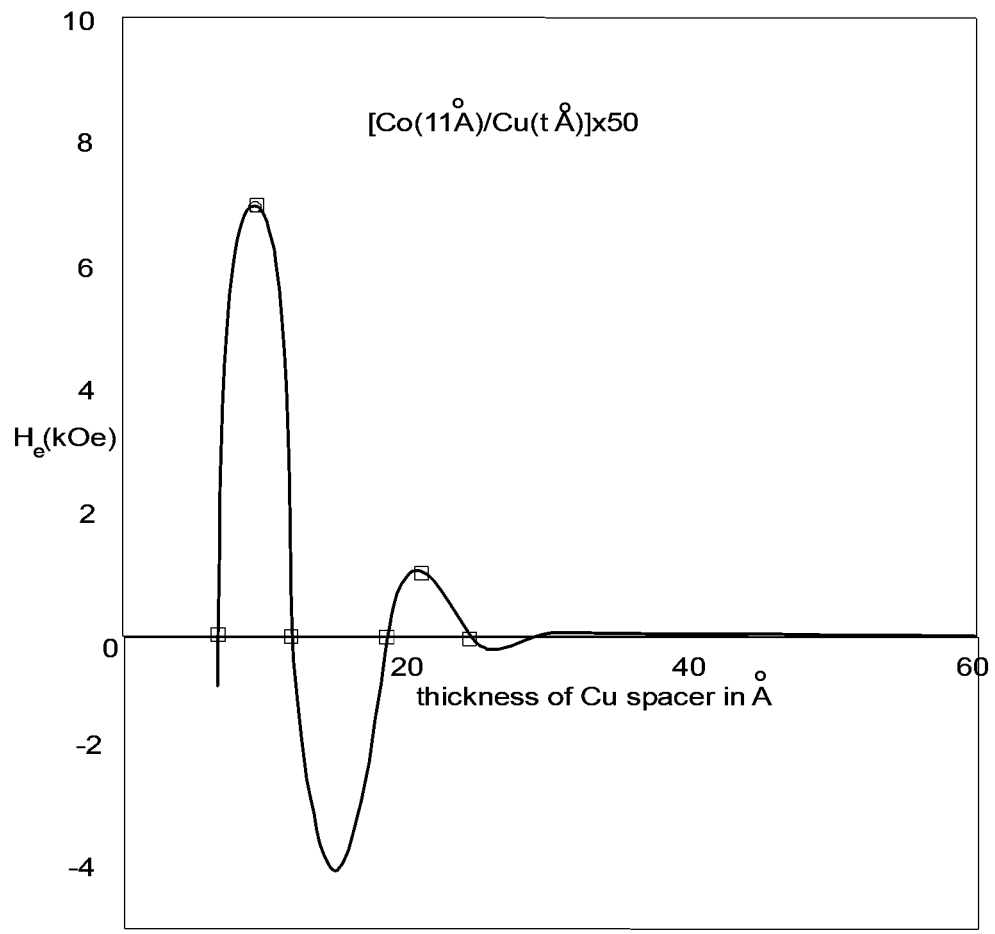
FIG. 1 is a graph illustrating exchange coupling field as a function of spacer thickness in a conventional multi-period lattice structure.
Figure 2:
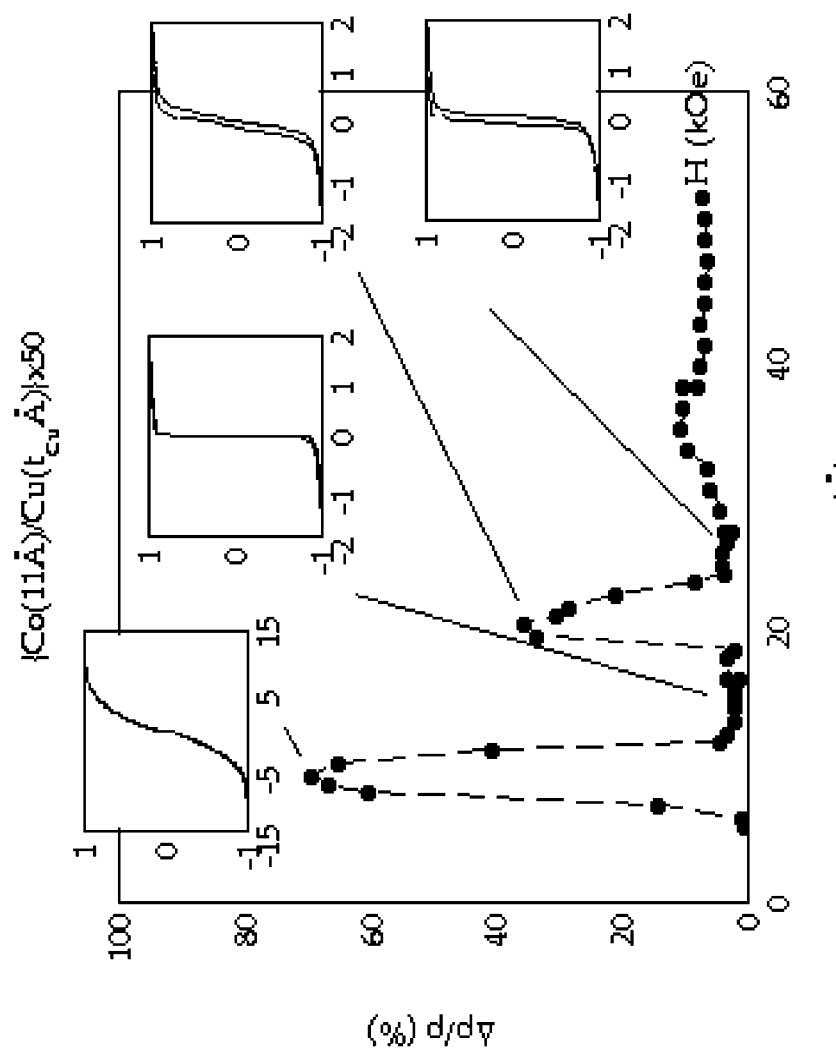
FIG. 2 is a graph illustrating GMR values as a function of spacer thickness in the structure represented by FIG. 1.
Figure 3:
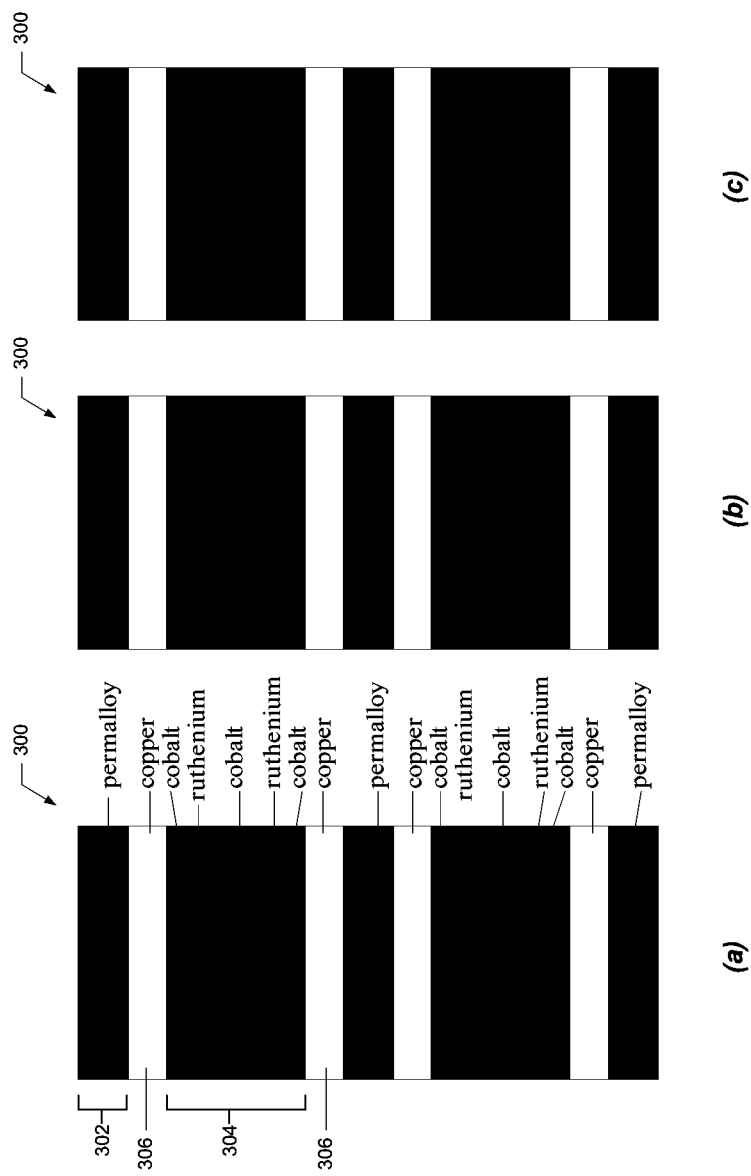
FIG. 3 shows three magnetization states of a multi-period ferromagnetically-coupled structure.

In giant magnetoresistance (GMR) structures described herein, an interface across which ferromagnetic coupling acts, and across which the relative magnetizations of two magnetic structures can be changed by an applied current, either directly or through the magnetic field it produces, to produce the GMR effect is referred to herein as an "active interface." Examples of active interfaces are the interfaces between the permalloy layers and the outer cobalt layers of the triad structures of FIG. 3 described below. In some cases, the applied magnetic fields sufficient to produce the GMR effect have magnitudes suitable for commercially viable implementations, e.g., below about 100 Oe and, in some implementations within the range of about 5 to 20 Oe.

By contrast, an interface across which the relative magnetizations of two layers do not change during device operation is referred to herein as a "passive interface." Examples of passive interfaces are the antiferromagnetic interfaces between the middle and outer cobalt layers of the triad structure of FIG. 3. As will be discussed, the fields required to switch the relative magnetizations across passive interfaces are significantly higher than for active interfaces, e.g., multiple orders of magnitude greater.

Each period of a GMR structure designed as described herein includes at least two different species of magnetic structures and one or more intervening non-magnetic layers between the different species of structures. An example of such a GMR structure 300 is shown in FIG. 3. As shown, each period of GMR structure 300 includes a structure 302 (implemented in this example as a monad structure with a single permalloy layer) and a structure 304 (implemented in this example as a triad structure with three cobalt layers separated by two layers of ruthenium).

Magnetic structures 302 and 304 are separated by intervening non-magnetic material 306 (implemented in this example with a single copper layer) It should be noted that these specific structures and materials are being presented by way of example, and that implementations are contemplated in which the monad may be replaced by a multi-layer structure, and/or in which the triad may be a more complex multi-layer structure. Similarly, the materials shown are merely examples of materials which may be employed to implement multi-period GMR structures as described herein. The scope of the invention should therefore not be limited by reference to the specific structures and materials shown in and described with reference to FIG. 3.

Each magnetic structure 304 in GMR structure 300 is itself an antiferromagnetic structure in which the overall direction of the magnetization is defined by the middle cobalt layer, i.e., the middle layer of the triad is thicker and thus has a higher magnetic moment than the magnetic moments of the outer layers of the triad combined. That is, spacer thicknesses are chosen such that the coupling between the layers of the triad is antiferromagnetic with the magnetizations of the two outer layers opposite to that of the middle layer. The antiferromagnetic coupling is sufficiently strong such that the triad acts as a single entity in response to applied fields that are within practical operating ranges (e.g., below about 100 Oe). For example, a ruthenium spacer layer of 6-7 Å between two cobalt layers results in an antiferromagnetic coupling that requires many thousands of Oersteds to establish parallel alignment between the two magnetizations.

According to a particular class of implementations, the triad parameters are chosen so that its resulting overall net magnetization is parallel to that of its middle layer, i.e. opposite to that of its outer layers. This requires that $m_2 > m_1 + m_3$, where m is the magnetic moment (magnetization times volume) of the material, and the subscripts 1, 2, and 3 refer to the outer, middle, and outer magnetic layers, respectively. In the case illustrated in FIG. 3, i.e., in which all three layers are constructed of the same material, the thickness, $t_2$, of the middle layer must be greater than the combined thicknesses of the outer layers to meet this constraint, i.e., $t_2 > t_1 + t_3$. However, this thickness requirement may be relaxed where different materials are used for the middle and outer layers, i.e., higher magnetization for the middle layer than for the outer layers. Such implementations may be particularly advantageous as GMR values increase with the number of active interfaces per unit superlattice thickness.

The thickness of the spacer between the monad and the triad is chosen so as to couple the monad magnetization and the magnetization of the outer layer of the triad ferromagnetically. At zero field or a small reverse field, this ferromagnetic coupling will set the magnetizations of the monad and the outer triad layer to parallel alignment.

And although GMR structures designed as described herein include magnetic structures in which the coupling is antiferromagnetic (e.g., the triad structures of FIG. 3), the active interfaces of these GMR structures are between the different species of magnetic structures in each period (e.g., between the permalloy layers and the outer cobalt layers of the adjacent triads in FIG. 3). These active interfaces are characterized by ferromagnetic coupling.

Referring again to the GMR structure illustrated in FIG. 3, combining the triad, with its strong internal antiferromagnetic coupling, and the monad, with its relatively weaker ferromagnetic coupling to the outer triad layer, introduces into the structure an intermediate exchange-coupling region. Drive fields too small to break the antiferromagnetic coupling within the triad are strong enough to overcome the ferromagnetic coupling between the monad and the outer triad layer, i.e. to drive the ferromagnetically-coupled magnetizations into antiparallel alignment, thereby realizing the GMR effect. And by implementing one of the two structures (i.e., either the monad or the triad) as having a coercivity lower than that of the other, the magnetization of the lower-coercivity structure may be reversed without affecting the magnetization of the higher-coercivity structure.

FIG. 3(a) illustrates the ground state of GMR structure 300 in which the magnetization of the permalloy monad is parallel with the magnetization of the outer cobalt layers of the triad, i.e., the magnetization vectors point in the same direction, as is characteristic of ferromagnetic coupling. This orientation may be reversed to the antiparallel orientation of FIG. 3(b) with a relatively low applied magnetic field (e.g., below about 100 Oe). As can be seen in FIG. 3(b), in this example, the monad is the lower-coercivity structure. GMR structure 300 has a relatively low resistance for parallel magnetizations of the monad and the outer layers of the antiferromagnetic structures, and a higher resistance for antiparallel magnetizations of the two. The ground state of the GMR structure is thus the low-resistance state.

The transition between the configuration of FIG. 3(a) and that of FIG. 3(b) is produced by a field large enough to reverse the monad (lower-coercivity) magnetization, but not that of the triad as a whole (higher coercivity). Pseudo spin valves have previously been applied by IME to devices in which both the lower-coercivity structure and the higher-coercivity structure have a dynamical role. For example, a pseudo spin valve has been used in SpinRAM®, a magnetic RAM in which the higher-coercivity layer is used for storage and the lower-coercivity layer for nondestructive readout; and in a Transpinnor®-based switch in which the higher-coercivity layer functions to set the switch and the lower-coercivity layer to operate it. In some cases employing multi-period GMR structures and in which both the triad and the monad structures have a dynamical role, the triad typically functions as the higher-coercivity structure and the monad as the lower-coercivity structure. It is possible, however, to engineer antiferromagnetic structures such as the triad with very low coercivity; much lower than that of permalloy. In devices based on such structures and in which both the higher-coercivity structure and the lower-coercivity structure have a dynamical role, the triad may function as the lower-coercivity structure and the monad as the higher-coercivity structure. The operating fields in the resulting devices are significantly lower than in those in which the triad functions as the higher-coercivity structure and the monad as the lower-coercivity structure.

Multi-period structures are also contemplated in which the monad structure is replaced by an engineered triad structure with sufficiently different coercivity from that of the other triad structure to have suitable operating margins for switching of the lower-coercivity structure without switching the higher-coercivity structure, each of which is characterized by a significantly lower coercivity than the monad structure of FIG. 3. This approach can lead to yet further reduction of the operating fields.

In some cases, this second triad structure is also characterized by antiferromagnetic coupling between adjacent ones its magnetic layers. According to some of these cases, the second triad structure is subject to the magnetic moment constraints discussed above with respect to the first triad structure. However, multi-period structures are contemplated in which such constraints are not required for the second triad structure.

Referring again to FIG. 3 and in contrast with the transition between the states illustrated in FIGS. 3(a) and 3(b), in order to drive all of the layers of the monads and triads to have the same orientation as shown in FIG. 3(c), a very large field (e.g., on the order of 10,000 Oe) must be applied to overcome the strong antiferromagnetic coupling of the layers of the triad, further emphasizing the unsuitability of antiferromagnetic GMR superlattice structures for practical applications.

Various combinations of magnetic materials known to those of skill in the art can be chosen for the different species of magnetic structures in each period of the overall multi-period GMR structure. For example, both structures may be constructed using cobalt, or both with permalloy. Alternatively, one structure may be constructed with cobalt and the other with permalloy. And as mentioned above, different magnetic materials may be used within the antiferromagnetic structure in each period. Examples of magnetic materials that may be suitable for use with various embodiments of the invention include, but are not limited to, Fe, NiFe (permalloy), Co (cobalt), FeCo, and CoFeB. Likewise, various non-magnetic materials can be used for the spacers including, but not limited to, Cu (copper) and Ru (ruthenium) as shown in FIG. 3, as well as Cr (chromium).

As mentioned above, the ground state of GMR structure 300 shown in FIG. 3(a) has relatively low resistance. The ferromagnetic exchange coupling across the copper spacer causes the magnetizations of the permalloy layer and the nearest cobalt layers to tend to be parallel. This state may occur spontaneously in zero applied field, or may require a small pulse to establish. The fully antiparallel state shown in FIG. 3(b) has relatively high resistance. It may be realized by applying a magnetic field that reverses the permalloy layer but leaves the magnetization of the triad intact. That is, the relative triad magnetizations are held in place by the antiferromagnetic exchange across the ruthenium spacer, and the triad as a whole does not switch because, in this example, the triad is the higher-coercivity structure and the applied field is not sufficient to overcome the triad coercivity.

Multi-period GMR structures having alternating monad and triad magnetic structures similar to the structure illustrated in FIG. 3 (with the monad being constructed from cobalt rather than permalloy) have been fabricated and tested with encouraging results. The triad structures showed very strong internal antiferromagnetic coupling. By introducing the triad structure into each period of the overall structure, making the net magnetization of the triad opposite to that of its outer layers, and making the magnetizations of the outer layers of the triad in the ground state of the overall structure parallel to that of the second species of magnetic structure in each period, e.g., the monad, the regions of zero GMR by which previous single-species lattices are characterized were eliminated. That is, GMR has been achieved with ferromagnetic coupling in a structure that enables operation of devices based on the structure to employ drive fields within practical operating ranges.

Figure 4:
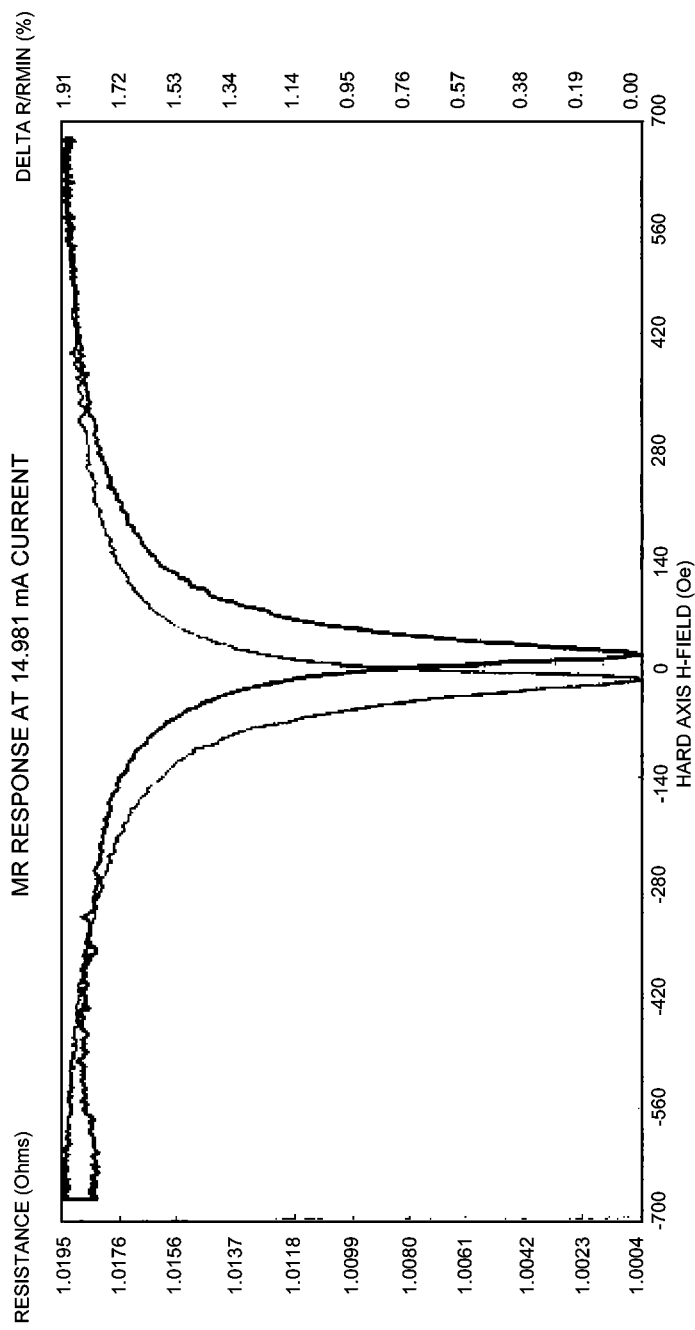
FIG. 4 is a graph illustrating experimental results for a multi-period ferromagnetically-coupled structure.

The experimental R-H (resistance vs. applied magnetic field) curve for a GMR structure implemented in accordance with a specific embodiment of the invention is shown in FIG. 4. It should be noted that the curve of FIG. 4 is inverted relative to the R-H curve of structures not employing multiple species of magnetic structures in each period, i.e., greater resistance at higher fields than at lower fields. It should also be noted that there was particularly good agreement between the theoretical and measured GMR values for the structure:

Si/SiO2/Ta50/Co50Cu40Co10/Ru8/Co40Ru8Co10/
Cu40/Co50Cu40Co10/Ru8/Co40Ru8Co10/Cu40/
Co50

The measured values of GMR for fabricated structures were small, as expected (see FIG. 4), because of the relatively small number of periods and the use of ruthenium for some of the spacers (as discussed below, copper spacers within each antiferromagnetic structure may result in higher GMR values). The experimental numerical value of GMR doubled between two and four periods. This proportionality of the GMR value to the number of periods is expected for small number of periods. In any case, the experimental results obtained prove that multi-period GMR structures may be successfully implemented in which the exchange coupling across the active interfaces of the structure is ferromagnetic. Because of the agreement between experimental results and theoretical predictions, it is expected that GMR values will rise significantly as the number of periods in the overall structure becomes large due to the increase in the number of active interfaces. This is further supported by the fact that over 50 periods were required before the full GMR effect was observed in antiferromagnetic superlattices.

It is also expected that the low drive fields with which the GMR effect may be observed in multi-period structures will persist as the number of periods increases. This is due to the fact that the required strength of the drive field is determined in relation to the ferromagnetic coupling the field has to overcome. This should not change significantly as the number of periods in the structure increase as long as the active interfaces are well separated from one another.

Computer modeling also suggests that the user of copper spacers within the antiferromagnetic structures in each period should yield higher GMR values, e.g., on the order of 50%, as compared to implementations which employ ruthenium which should yield GMR values more on the order of 14%. The likely reason is that copper has higher conductivity. An important factor in raising GMR values for a given choice of materials will likely be the number, per unit thickness, of active interfaces. Reduction in the thickness of the magnetic structures in each period is therefore important.

Multi-period structures implemented as described herein may be used to implement a wide variety of systems and devices. For example, such multi-period structures may be used to implement memory cells. Examples of memory cells that may be implemented using the structures described herein are described in U.S. Pat. Nos. 5,587,943, 6,594,175, 7,911,830, and U.S. Pat. No. 9,741,923, each of which is incorporated herein by reference in its entirety for all purposes.

The binary state of a memory cell implemented as described herein may be represented by the overall magnetization of the higher-coercivity structures within the overall multi-period structure. In such implementations, the write field is sufficiently strong to set this magnetization while maintaining the structure's internal antiferromagnetic coupling and much lower (preferably orders of magnitude) than what is required to saturate the entire structure. The read field is weaker still, being only strong enough to switch the lower-coercivity structures within the overall structure to determine whether the alignment of the outer-layer magnetizations across the active interface is parallel or antiparallel by observing the change in resistance.

Figure 5:
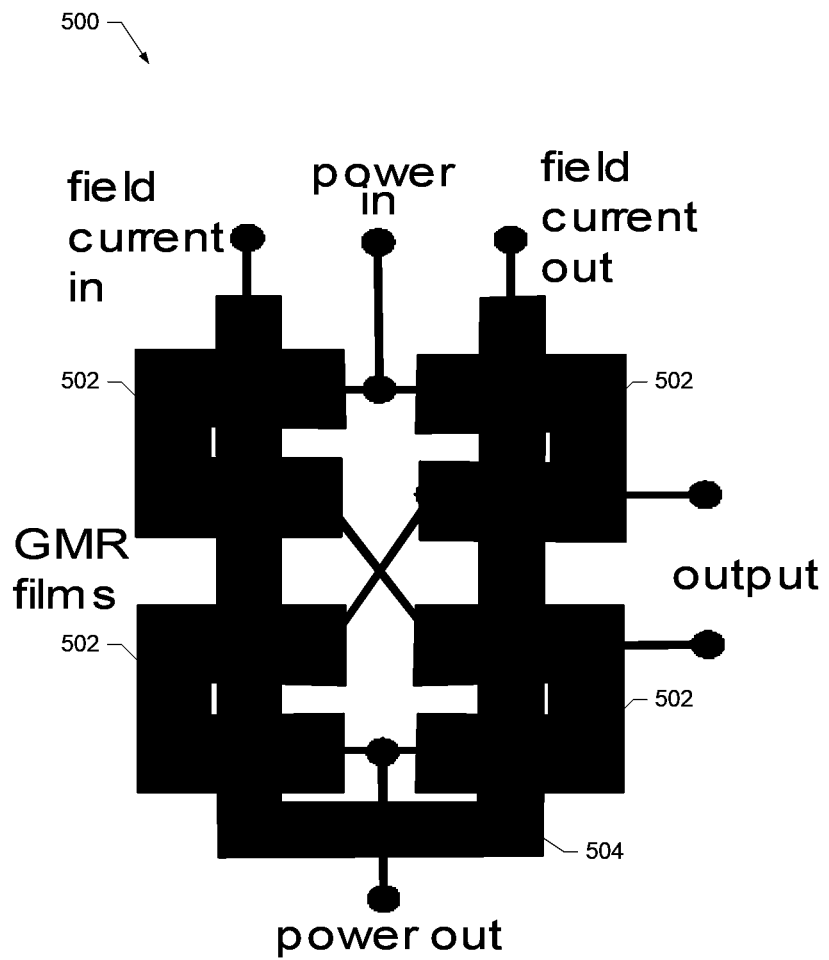
FIG. 5 is a simplified representation of a solid-state component implemented using a multi-period structure.

In other examples, multi-period structures implemented as described herein may be used to implement solid-state components which may be the basis for a wide variety of magnetic and electronic circuits, devices, and systems. FIG. 5 shows a simplified, schematic representation of such a solid-state component, Transpinnor® 500, in which four multi-period GMR structures 502 are disposed in a bridge configuration. It should be noted that only one of structures 502 needs to be a GMR structure, i.e., 1 to 3 of the structures may be replaced with resistors. A stripline 504 is inductively coupled to (and typically electrically insulated from) GMR structures 502 for supplying a magnetic field thereto. An input current in stripline 504 produces a magnetic field that controls the orientation of the magnetic layers in multi-period GMR structures 502, and thereby the resistance of those structures and the output voltage and current. The stripline current operates the device; the power current is amplified.

The Transpinnor® has characteristics similar to both transistors and transformers. Like a transistor, it can be used for amplification, logic, or switching. Like a transformer, it can be used to step voltages and currents up or down, and the input is resistively isolated from the output, i.e., the only connection between input and output is inductively through a magnetic field so there is no low-frequency resistive path between input and output. Unlike ordinary transformers, a transpinnor has no low-frequency cutoff; the coupling is flat down to and including dc. The gain is proportional to the supply voltage (or current); doubling the supply voltage (or current) results in doubling both voltage output and current output.

Further examples of such solid-state components, as well as devices and systems incorporating such components, that may be implemented using structures enabled by the present disclosure, please refer to U.S. Pat. Nos. 5,929,636, 6,031,273, 6,469,927, 6,538,437, 6,573,713, 6,738,284, 6,859,063, 6,992,919, 7,005,852, 7,220,968, and 7,224,566, the entire disclosure of each of which is incorporated herein by reference for all purposes.

Figure 6:
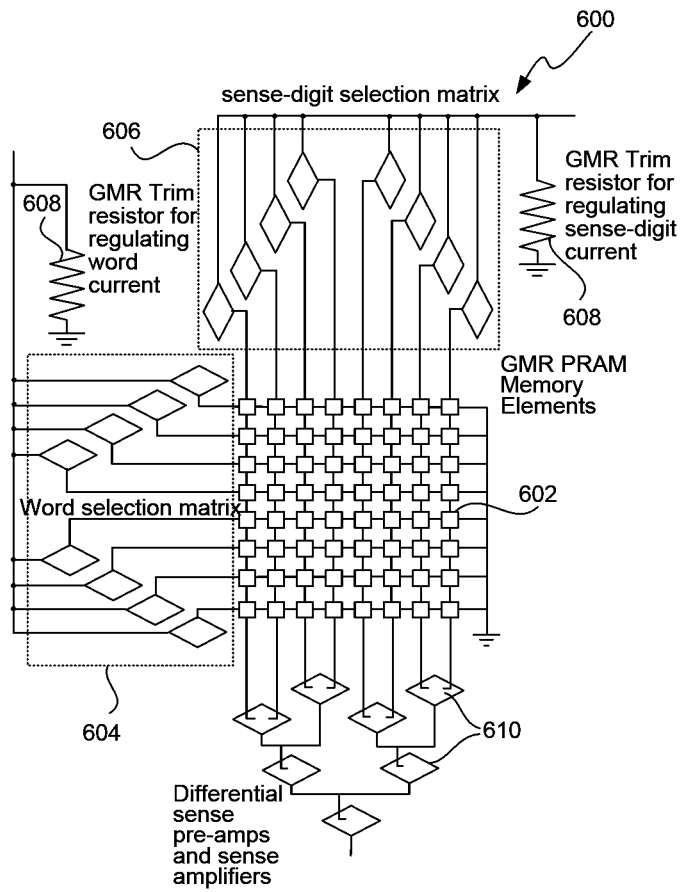
FIG. 6 is a simplified representation of a memory implemented using multi-period structures.

The foregoing paragraphs should also make it clear that multi-period structures designed as described herein may be used to partially or fully implement systems including both memory and electronics. FIG. 6 is a simplified diagram of such a system; an all metal random access memory 600, e.g., SpinRAM®. For the sake of clarity, only 64 memory cells 602 (which are implemented using multi-period structures as described herein) have been shown. It will be understood, however, that the simplified architecture of FIG. 6 may be generalized to any size memory array desired. It should also be noted that the control lines for the selection electronics have been omitted for the same purpose.

Transpinnors® based on the multi-period structures described herein form the basis for the all-metal support electronics for memory 600. Transpinnor®-based circuitry is used to select the word lines to be activated (604), the sense-digit and reference lines to activated (606), regulate the voltage to the drive lines (608), amplify the difference in current between selected sense-digit and reference line pairs (610), and perform further sense amplification in successive stages.

Examples of memories that may be implemented using memory cells and/or circuit components constructed using multi-period structures as described herein are described in U.S. Pat. Nos. 5,587,943, 6,469,927, 6,483,740, 6,594,175, and 6,992,919, the entire disclosure of each of which is incorporated herein by reference for all purposes.

As described herein, it has been observed that a thin-film structure with more than one period improves the GMR of the structure as the number of periods increases. A problem has been identified when such structures are etched into lines or other features.

The empty spaces between these etched lines or other features that are created by the etching process are referred to herein as "gaps." When the thickness of the thin-film structures is low (e.g., a single period), the gaps between the lines or other features can be etched without significant problem. Gaps having dimensions on the same order as the thickness of the thin-film structures are routinely achieved. In some cases, an etching process may be optimized to achieve gaps that are about the same size as a single period of the thin-film structure even where the number of periods in the structure is in the range of 3 or 4 periods. However, gap dimensions increase significantly (e.g., to about the total structure thickness) when the number of periods is significantly higher, e.g., in the range of 50 or 100 periods. This runs contrary to the desire to keep the etched gap (or minimum etched feature size) to approximately the same size as a period of the thin-film structure.

According to a particular class of implementations, a series of etched layers is constructed, one on top of another, where the series of layers results in multi-period thin-film structures having such characteristics. For example, multi-period GMR structures such as those described above may be constructed. An example will be described with reference to FIGS. 7A-7I. It should be noted that at least some of the features of the depicted structures are exaggerated and/or not shown to scale for the purpose of clarity.

Figure 7A:
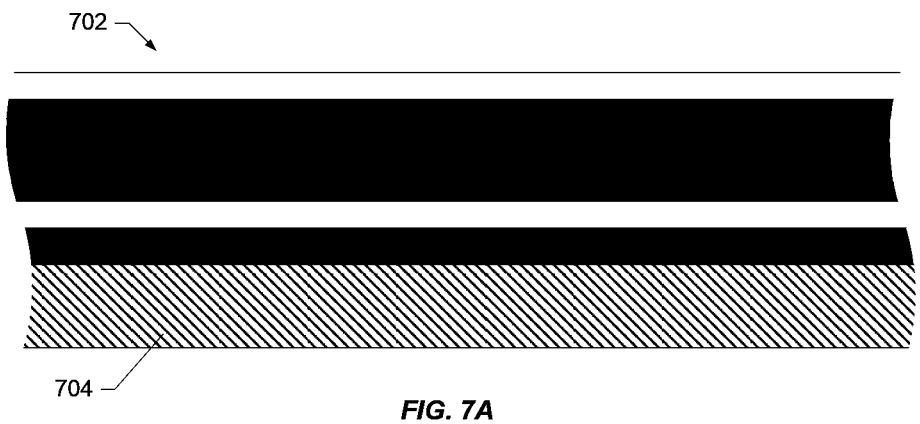
FIGS. 7A-7I illustrate a process for fabricating a multi-period thin-film structure.
Figure 7B:
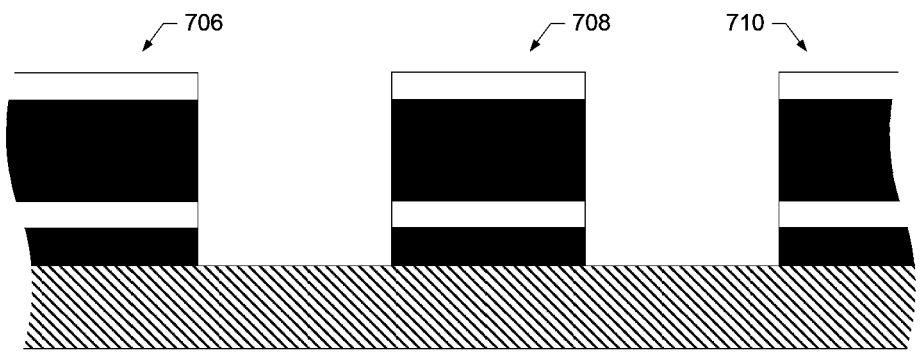

The first layer could be a GMR thin-film layer with only as many periods as can be tolerated (e.g., one to four) to obtain the desired gap or feature size (e.g., on the order of the thickness of one period). The example depicted in FIG. 7A shows a thin-film layer 702 on a substrate 704. Layer 702 has a single period that includes both species of magnetic layers described above with reference to FIG. 3. This layer is then etched as required to achieve multi-layer GMR structures 706-710 that are characterized by the desired gap or feature size as shown in FIG. 7B.

Figure 7C:
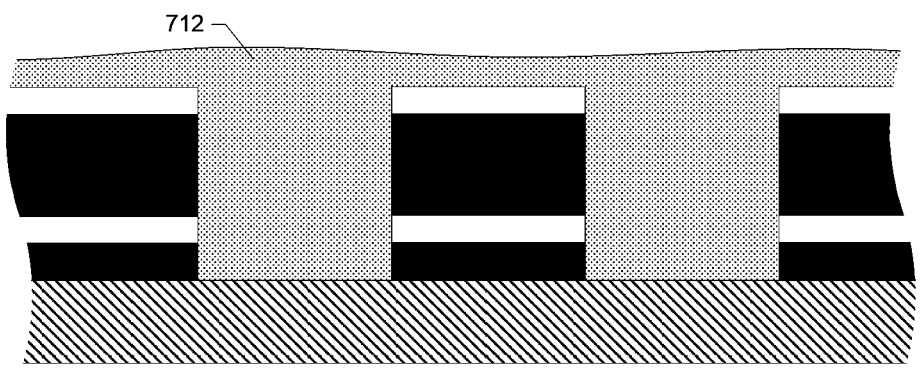
Figure 7D:
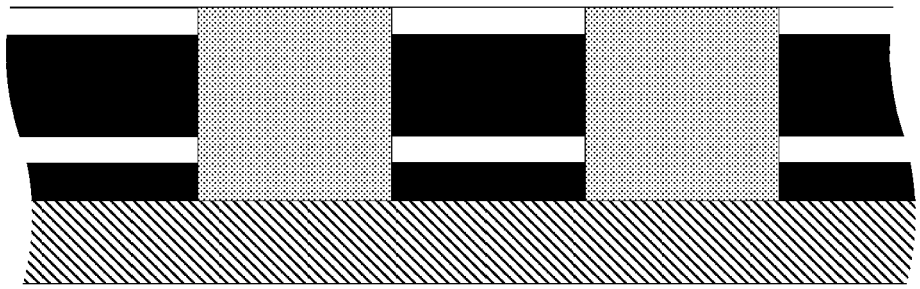
Figure 7E:

The etched layer is then planarized as shown in FIG. 7C. The planarizing step fills in the gaps between GMR structures with a suitable insulating material 712. There are many available planarizing materials that could be suitable for this purpose. For example, SiO is an excellent smoothing material. Several plastics (e.g., Kapton) would also be suitable. Planarizing is followed by a polishing step that exposes the top surfaces of the GMR structures, permitting electrical contact to the GMR structures as shown in FIG. 7D. The last sub-layer of the first GMR film has a wider tolerance on thickness and can be made to accommodate some thickness loss due to polishing.

Figure 7F:
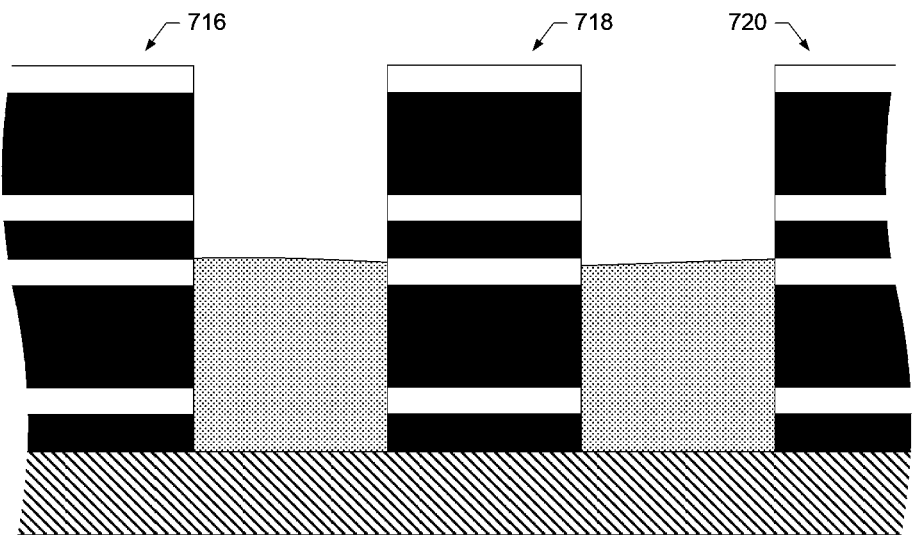
Figure 7G:
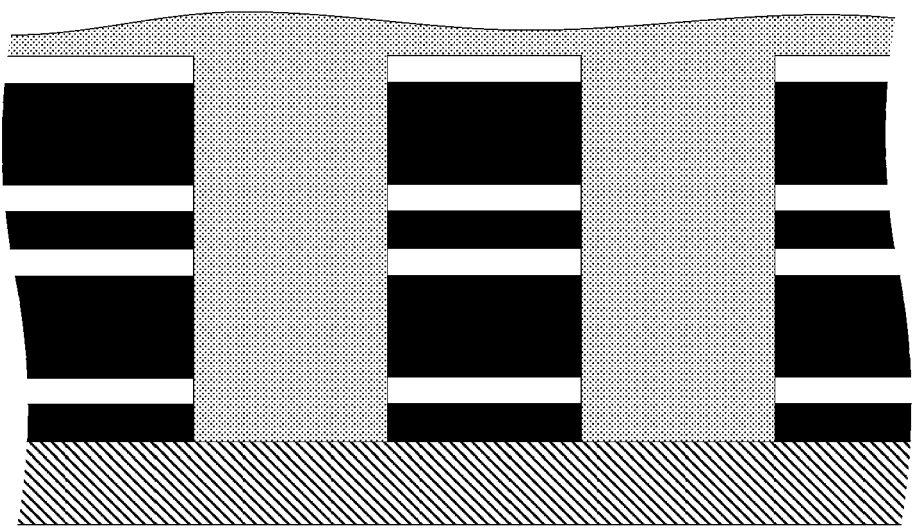
Figure 7H:
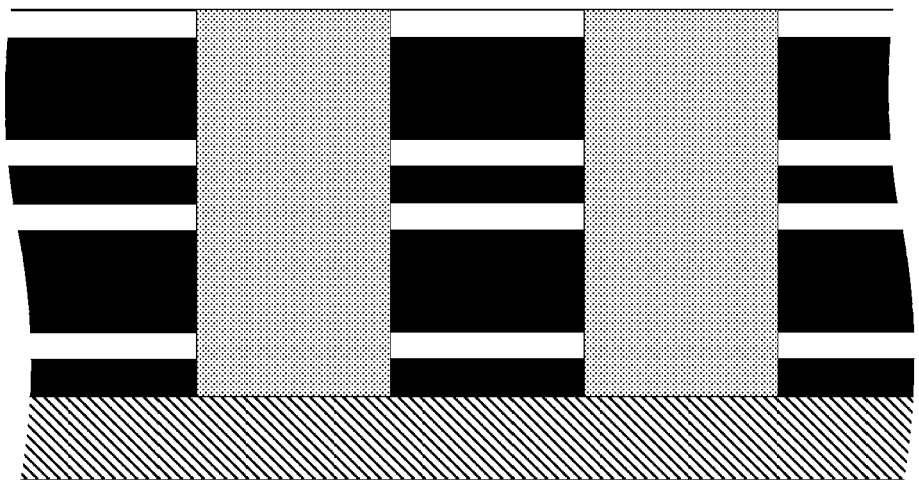
Figure 7I:
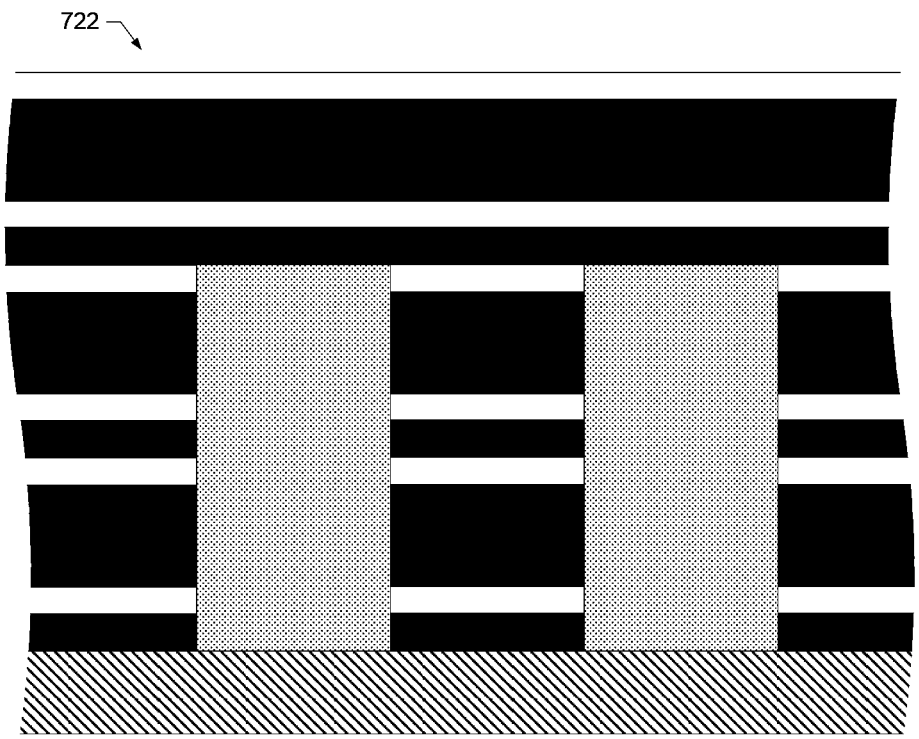

Another GMR film layer 714 is then deposited, etched, planarized, and polished in a manner similar to the first as shown in FIGS. 7E-7H. As shown in FIGS. 7F-7H, the resulting thin-film structures 716-720 of the second GMR layer are aligned and in contact with the structures that resulted from the first GMR layer. As represented by the addition of a third GMR layer 722 in FIG. 7I, these processing steps can be repeated as many times as desired (e.g., 50 or 100 times or more) to achieve an arbitrarily tall structure while preserving the desired narrow gap or feature size up through the series of layers. For example, using such an approach, a 20 nm gap between thin-film structures that are 1 micron thick may be achieved. This is achievable for the feature size of the thin-film structures themselves. For example, tall and narrow thin-film structures (e.g., GMR striplines) could be made using such an approach, e.g., 20 nm wide GMR striplines that are 1 micron tall (possibly with 20 nm gaps between the striplines). Note that imperfect alignments might produce some roughness in the vertical walls but this is not critical in this application.

It should also be noted that the technique described with reference to FIGS. 7A-7I is not limited to thin-film structures as described herein or multi-layer or multi-period structures that exhibit GMR. Rather, this technique may be used to achieve arbitrarily thick multi-layer structures with very narrow spacing and/or features sizes. One example of such a multi-layer structure is a capacitor constructed with closely spaced vertical plates to save space.

Moreover, the technique described with reference to FIGS. 7A-7I is not limited to the materials described. For example, the technique may be applied to structures that include polysilicon films with additional processing (e.g., heat treatment) to get the crystallite properties of the polysilicon right. Other materials include various insulators such as, for example, silicon carbine, aluminum oxides, and sapphire wafers, to name a few representative examples.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A method, comprising:
    forming a first multi-layer film on a substrate;
    etching the first multi-layer film to form a plurality of first structures;
    planarizing the first structures with a planarizing material;
    removing a portion of the planarizing material to expose a top surface of each of the first structures;
    forming a second multi-layer film on the remaining planarizing material and the top surfaces of the first structures;
    etching the second multi-layer film to form a plurality of second structures, each of the second structures being aligned with and in contact with the top surface of a corresponding one of the first structures and forming one of a plurality of third structures therewith;
    planarizing the third structures with the planarizing material;
    removing a portion of the planarizing material to expose a top surface of each of the third structures; and
    repeating the forming, etching, planarizing, and removing one or more times resulting in a plurality of fourth structures characterized by a minimum spacing, wherein a gap between two adjacent fourth structures is the minimum spacing across all layers of the two adjacent fourth structures.

2. The method of claim 1, wherein the forming, etching, planarizing, and removing are repeated more than about 50 times.

3. The method of claim 1, wherein a width of one of the fourth structures is about a thickness of one of the first structures.

4. The method of claim 1, wherein the fourth structures exhibit giant magnetoresistance (GMR).

5. The method of claim 1, wherein each of the fourth structures is a multi-period structure, and wherein each period of each multi-period structure includes:
    a first portion having a plurality of magnetic layers separated by intervening non-magnetic layers, the plurality of magnetic layers including outer magnetic layers, the first portion being characterized by antiferromagnetic coupling between adjacent ones of the magnetic layers, and having an overall magnetization orientation that is antiparallel with magnetization orientations of the outer magnetic layers; and
    a second portion adjacent and separated from the first portion by an intervening non-magnetic layer, the second portion comprising one or more magnetic layers.

6. The method of claim 5, wherein the second portion of each period of each multi-period structure has an active magnetic interface with the outer magnetic layer of the corresponding first portion, the active magnetic interface being characterized by ferromagnetic coupling, and wherein when relative magnetization orientations across each active magnetic interface are reversed, a resistance of the multi-period structure changes.

7. The method of claim 5, wherein the first portion of each period of each multi-period structure is characterized by a higher coercivity than the corresponding second portion.

8. The method of claim 5, wherein the second portion of each period of each multi-period structure is characterized by a higher coercivity than the corresponding first portion.

9. The method of claim 5, wherein each of the first structures and each of the second structures correspond to a single period of the corresponding multi-period structure.

10. The method of claim 5, wherein each of the first structures and each of the second structures correspond to more than one period of the corresponding multi-period structure.

11. The method of claim 1, wherein the plurality of fourth structures is characterized by a minimum feature size, and wherein the minimum spacing is substantially the same as the minimum feature size.

12. The method of claim 1, wherein a height of the fourth structures is at least about 50 times the minimum spacing.

13. The method of claim 1, wherein the plurality of fourth structures is characterized by a minimum feature size, and wherein a height of the fourth structures is at least about 50 times the minimum feature size.

14. A method, comprising:
forming a first multi-layer film on a substrate;
etching the first multi-layer film to form a plurality of first structures;
planarizing the first structures with a planarizing material;
removing a portion of the planarizing material to expose a top surface of each of the first structures;
forming a second multi-layer film on the remaining planarizing material and the top surfaces of the first structures;
etching the second multi-layer film to form a plurality of second structures, each of the second structures being aligned with and in contact with the top surface of a corresponding one of the first structures and forming one of a plurality of third structures therewith;
planarizing the third structures with the planarizing material;
removing a portion of the planarizing material to expose a top surface of each of the third structures; and
repeating the forming, etching, planarizing, and removing one or more times resulting in a plurality of fourth structures characterized by a minimum feature size, wherein a first feature size of a particular one of the fourth structures is the minimum feature size across all layers of the particular one of the fourth structures.

15. The method of claim 14, wherein the forming, etching, planarizing, and removing are repeated more than about 50 times.

16. The method of claim 14, wherein a width of one of the fourth structures is about a thickness of one of the first structures.

17. The method of claim 14, wherein the fourth structures exhibit giant magnetoresistance (GMR).

18. The method of claim 14, wherein each of the fourth structures is a multi-period structure, and wherein each period of each multi-period structure includes:
a first portion having a plurality of magnetic layers separated by intervening non-magnetic layers, the plurality of magnetic layers including outer magnetic layers, the first portion being characterized by antiferromagnetic coupling between adjacent ones of the magnetic layers, and having an overall magnetization orientation that is antiparallel with magnetization orientations of the outer magnetic layers; and
a second portion adjacent and separated from the first portion by an intervening non-magnetic layer, the second portion comprising one or more magnetic layers.

19. The method of claim 18, wherein the second portion of each period of each multi-period structure has an active magnetic interface with the outer magnetic layer of the corresponding first portion, the active magnetic interface being characterized by ferromagnetic coupling, and wherein when relative magnetization orientations across each active magnetic interface are reversed, a resistance of the multi-period structure changes.

20. The method of claim 18, wherein the first portion of each period of each multi-period structure is characterized by a higher coercivity than the corresponding second portion.

21. The method of claim 18, wherein the second portion of each period of each multi-period structure is characterized by a higher coercivity than the corresponding first portion.

22. The method of claim 18, wherein each of the first structures and each of the second structures correspond to a single period of the corresponding multi-period structure.

23. The method of claim 18, wherein each of the first structures and each of the second structures correspond to more than one period of the corresponding multi-period structure.

24. The method of claim 14, wherein the plurality of fourth structures is characterized by a minimum spacing, and wherein the minimum spacing is the same as the minimum feature size.

25. The method of claim 24, wherein a height of the fourth structures is at least about 50 times the minimum spacing.

26. The method of claim 14, wherein a height of the fourth structures is at least about 50 times the minimum feature size.

* * * * *